US007316574B2

(12) United States Patent  
Che et al.

(10) Patent No.: US 7,316,574 B2  
(45) Date of Patent: Jan. 8, 2008

(54) SYSTEMS AND METHODS FOR PROTECTING AN ELECTRICAL COMPONENT FROM IMPACT OR REPEATED MECHANICAL STRESS

(75) Inventors: Kenny Che, Richmond (CA); Andrew Wu, Richmond (CA); Zi Fu Zheng, Guangdon (CN)

(73) Assignee: VTech Telecommunications Limited, New Territory (HK)

( * ) Notice: Subject to any disclaimer, the term of this patent is extended or adjusted under 35 U.S.C. 154(b) by 46 days.

(21) Appl. No.: 11/027,992

(22) Filed: Jan. 4, 2005

(65) Prior Publication Data

US 2006/0148284 A1    Jul. 6, 2006

(51) Int. Cl.  
*H01R 12/00* (2006.01)

(52) U.S. Cl. .................................. 439/76.1
(58) Field of Classification Search ........... 439/76.1; 361/770  
See application file for complete search history.

(56) References Cited

U.S. PATENT DOCUMENTS

| | | | |
|---|---|---|---|
| 3,304,468 A | | 2/1967 | Lawson |
| 4,200,900 A | * | 4/1980 | McGeorge .............. 174/138 D |
| 4,297,769 A | * | 11/1981 | Coules .................... 174/138 D |
| 4,588,854 A | * | 5/1986 | Bailey et al. ............... 439/567 |
| 5,008,777 A | * | 4/1991 | Burns ......................... 361/804 |
| 5,933,343 A | * | 8/1999 | Lu et al. ..................... 363/144 |
| 6,049,467 A | * | 4/2000 | Tamarkin et al. ........... 361/790 |
| 6,618,267 B1 | | 9/2003 | Dalal et al. |
| 2004/0089943 A1 | | 5/2004 | Kirigaya et al. |

FOREIGN PATENT DOCUMENTS

| | | |
|---|---|---|
| WO | WO 01/48821 | 12/1999 |
| WO | WO 00/47027 | 8/2000 |

OTHER PUBLICATIONS

GB Search Report, dated Apr. 25, 2006.

* cited by examiner

*Primary Examiner*—Briggitte R. Hammond  
(74) *Attorney, Agent, or Firm*—Paul, Hastings, Janofsky & Walker LLP

(57) ABSTRACT

An electrical component is mounted on a carrier printed circuit board. A first header connector connects the carrier printed circuit board to a printed circuit board on one side of the electrical component. A second header connector connects the carrier printed circuit board to the printed circuit board on the opposite side of the electrical component. The carrier printed circuit board and the printed circuit board are connected so that the electrical component is sandwiched between the carrier printed circuit board and the printed circuit board. The carrier printed circuit board, the first header connector, and the second header connector protect the electrical component from impact and mechanical stress. The carrier printed circuit board redistributes the electrical connection of the electrical component.

38 Claims, 13 Drawing Sheets

SYSTEMS AND METHODS FOR PROTECTING AN ELECTRICAL COMPONENT FROM IMPACT OR REPEATED MECHANICAL STRESS

BACKGROUND OF THE INVENTION

1. Field of the Invention

Embodiments of the present invention relate to systems and methods for protecting an electrical component from impact or repeated mechanical stress. More particularly, embodiments of the present invention relate to systems and methods for mounting a component on a printed circuit board while protecting the component from mechanical stress and allowing the electrical connections with the printed circuit board to be redistributed.

2. Background Information

Surface mounted electrical components generally allow printed circuit boards to contain more circuitry per unit area than through-hole mounted electrical components. As a result, surfaced mounted components are typically used in applications requiring small and more densely populated printed circuit boards.

Because of their superior mechanical strength, however, some through-hole mounted electrical components are used even on small and densely populated printed circuit boards. These through-hole mounted electrical components can include but are not limited to switches, connectors, displays, fans, transmitters, receivers, transformers, or light emitting diodes (LEDs).

Mounting a through-hole electrical component on a small printed circuit board mainly populated with surface mounted electrical components is a significant design challenge. Because of their relatively larger size, the connector pins of the through-hole electrical component must be moved farther away from surface mounted components. Moving the surface mounted components farther away from the through-hole electrical component increases the overall printed circuit board area and, therefore, its cost.

In addition, some surface mounted electrical components and even through-hole electrical components are subjected to such significant impacts or so much repeated mechanical stress that their soldering joints cannot provide enough support. In this case, custom made brackets of plastic or metal are typically used to further secure these electrical components to the printed circuit board. Such custom made brackets require extra tooling, can take up even more space on the printed circuit board, and increase the overall cost of the printed circuit board.

In view of the foregoing, it can be appreciated that a substantial need exists for systems and methods that can allow an electrical component to be mounted on a printed circuit board while protecting the component from mechanical stress and allowing the electrical connections of the electrical component with the printed circuit board to be redistributed.

BRIEF SUMMARY OF THE INVENTION

One embodiment of the present invention is a system for mounting a through-hole mounted headset jack on a printed circuit board that includes a carrier printed circuit board, a first through-hole mounted header connector, and a second through-hole mounted header connector. The through-hole mounted headset jack is through-hole mounted on the carrier printed circuit board and at least one electrical connection of the through-hole mounted headset jack is distributed from a lead of the through-hole mounted headset jack to a through-hole soldering pad of the carrier printed circuit board by the carrier printed circuit board. The first through-hole mounted header connector connects the carrier printed circuit board to the printed circuit board. The second through-hole mounted header connector also connects the carrier printed circuit board to the printed circuit board. The carrier printed circuit board and the printed circuit board are connected by the first through-hole mounted header connector and second through-hole mounted header connector so that the through-hole mounted headset jack is located between the carrier printed circuit board and the printed circuit board. The first through-hole mounted header connector and the second through-hole mounted header connector are located on opposite sides of the through-hole mounted headset jack. The first through-hole mounted header connector electrically connects the through-hole soldering pad of the carrier printed circuit board with a through-hole soldering pad of the printed circuit board.

Another embodiment of the present invention is a system for mounting an electrical component on a printed circuit board that includes a carrier printed circuit board, a first header connector, and a second header connector. The electrical component can include but is not limited to a switch, a connector, a fan, a display, a transmitter, a receiver, a transformer, or an LED. The electrical component is mounted on the carrier printed circuit board and at least one electrical connection of the electrical component is distributed from a lead of the electrical component to a soldering pad of the carrier printed circuit board by the carrier printed circuit board. The first header connector connects the carrier printed circuit board to the printed circuit board. The second header connector also connects the carrier printed circuit board to the printed circuit board. The carrier printed circuit board and the printed circuit board are connected by the first header connector and second header connector so that the electrical component is located between the carrier printed circuit board and the printed circuit board. The first header connector and the second header connector are located on opposite sides of the electrical component. The first header connector electrically connects the soldering pad of the carrier printed circuit board with a soldering pad of the printed circuit board.

Another embodiment of the present invention is a method for mounting an electrical component on a printed circuit board. The electrical component can include but is not limited to a switch, a connector, a fan, a display, a transmitter, a receiver, a transformer, or an LED. The electrical component is mounted on a carrier printed circuit board. At least one electrical connection of the electrical component is distributed from a lead of the electrical component to a soldering pad of the carrier printed circuit board by the carrier printed circuit board. A first header connector is connected to the carrier printed circuit board on one side of the electrical component. A second header connector is connected to the carrier printed circuit board on the opposite side of the electrical component. The first header connector is connected to the printed circuit board. The first header connector electrically connects the soldering pad of the carrier printed circuit board with a soldering pad of the printed circuit board. The second header connector is connected to the printed circuit board. The carrier printed circuit board and the printed circuit board are connected by the first header connector and second header connector so that the electrical component is located between the carrier printed circuit board and the printed circuit board.

Figure 1:
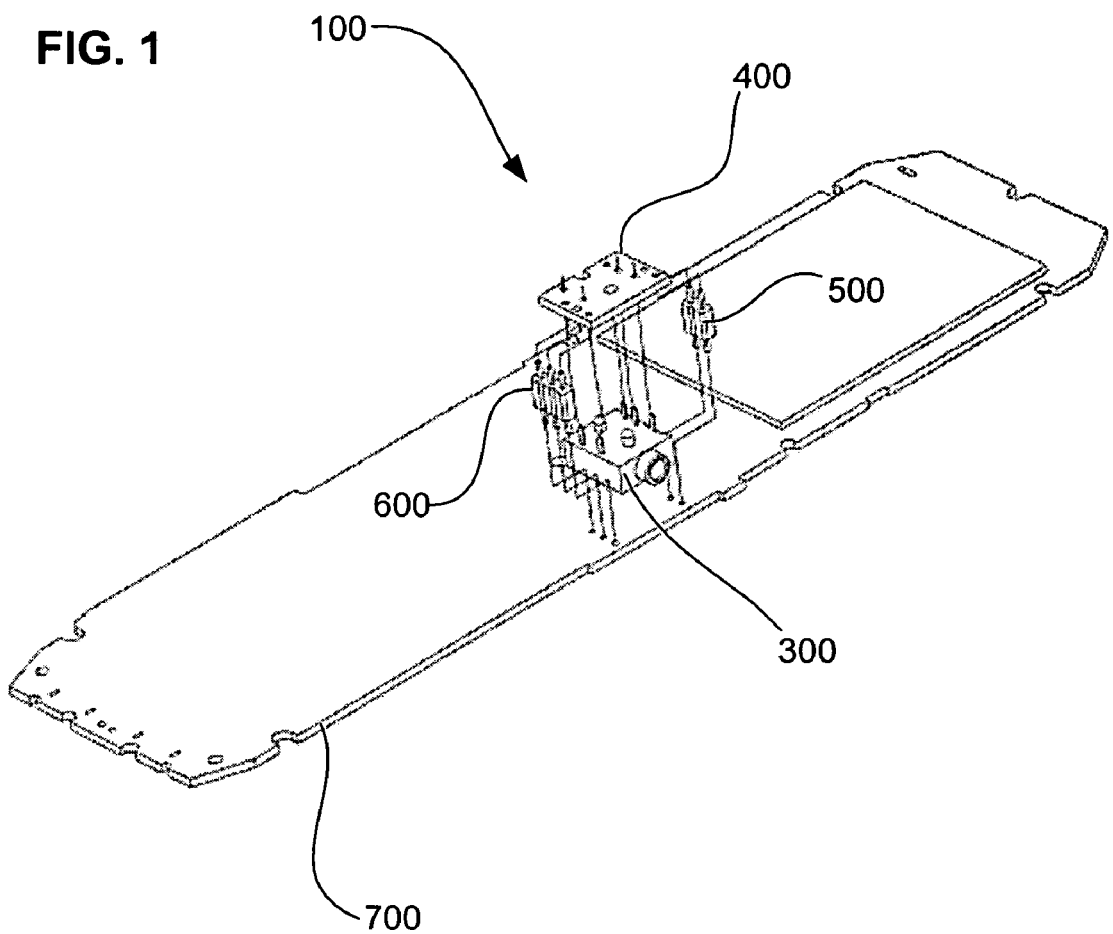
FIG. 1 is schematic diagram showing an exploded state of an exemplary system for mounting an electrical component on a printed circuit board, while protecting the electrical component from mechanical stress and allowing the electrical connections with the printed circuit board to be redistributed, in accordance with an embodiment of the present invention.

Before one or more embodiments of the invention are described in detail, one skilled in the art will appreciate that the invention is not limited in its application to the details of construction, the arrangements of components, and the arrangement of steps set forth in the following detailed description or illustrated in the drawings. The invention is capable of other embodiments and of being practiced or being carried out in various ways. Also, it is to be understood that the phraseology and terminology used herein is for the purpose of description and should not be regarded as limiting.

DETAILED DESCRIPTION OF THE INVENTION

FIG. 1 is schematic diagram showing an exploded state of an exemplary system 100 for mounting electrical component 300 on printed circuit board (PCB) 700, while protecting the electrical component 300 from mechanical stress and allowing the electrical connections with PCB 700 to be redistributed, in accordance with an embodiment of the present invention. Electrical component 300 is mounted to carrier PCB 400 by connecting the electrical component leads of electrical component 300 to the component soldering pads of carrier PCB 400. Electrical component 300 is, therefore, connected mechanically and electrically to carrier PCB 400 through the electrical component leads of electrical component 300 and the component soldering pads of carrier PCB 400. Carrier PCB 400 redistributes one or more electrical signals received from the electrical component leads through the component soldering pads to the header connector soldering pads of carrier PCB 400. This redistribution of electrical signals effectively redistributes the electrical connections of electrical component 300 on carrier PCB 400 and, in turn, on PCB 700.

Header connector 500 and header connector 600 mechanically connect carrier PCB 400 to PCB 700. The header connector leads on one side of the header connector housing of header connector 500 connect to the header connector soldering pads of carrier PCB 400, and the header connector leads on the other side of the header connector housing of header connector 500 connect to PCB soldering pads 710 of PCB 700. Likewise, the header connector leads on one side of the header connector housing of header connector 600 connect to the header connector soldering pads of carrier PCB 400, and the header connector leads on the other side of the header connector housing of header connector 600 connect to the PCB soldering pads of PCB 700. Header connector 500 and header connector 600 connect carrier PCB 400 to PCB 700 so that electrical component 300 is sandwiched between carrier PCB 400 and PCB 700. Header connector 500 and header connector 600 are located on opposite sides of electrical component 300 to provide the greatest amount of mechanical strength and stability.

Header connector 500 and header connector 600 also electrically connect carrier PCB 400 to PCB 700. Header connector 500 and header connector 600 are used to carry at least one electrical signal from a header connector soldering pad of carrier PCB 400 to a soldering pad of PCB 700. In another embodiment of the present invention, header connector 500 and header connector 600 are used to carry all of the electrical signals from the header connector soldering pads of carrier PCB 400 to the soldering pads of PCB 700.

In order to provide the greatest possible mechanical strength to system 600, the electrical component housing of electrical component 300, is substantially in contact with carrier PCB 400, PCB 700, the header connector housing of header connector 500, and the header connector housing of header connector 600. In alternative embodiments of the present invention that provide less mechanical strength to system 600, the electrical component housing of electrical component 300, is not substantially in contact with carrier PCB 400, PCB 700, the header connector housing of header connector 500, or the header connector housing of header connector 600.

In another embodiment of the present invention, guide pins of the electrical component housing of electrical component 300 that protrude from the electrical component housing are used to further secure electrical component 300 mechanically to carrier PCB 400. The guide pins of the electrical component housing of electrical component 300 are inserted into carrier PCB holes of carrier PCB 400 when electrical component 300 is mounted to carrier PCB 400.

In another embodiment of the present invention, second guide pins (not shown) of the electrical component housing of electrical component 300 that protrude from the electrical component housing are used to further secure electrical component 300 mechanically to PCB 700. These second guide pins protrude from the electrical component housing 510 on the side opposite to the guide pins that mechanically connect electrical component 300 with carrier PCB 400. These second guide pins can be formed into a shape including but not limited to a substantially cylindrical, a substantially rectangular shape, a substantially spherical shape, a substantially triangular shape, or a tablet shape. These second guide pins of the electrical component housing of electrical component 300 are inserted into corresponding holes (not shown) in PCB 700, when carrier PCB 400 is mounted to PCB 700. These corresponding holes can be formed into a shape including but not limited to a substantially cylindrical, a substantially rectangular shape, a substantially spherical shape, a substantially triangular shape, or a tablet shape.

In another embodiment of the present invention, a third header connector (not shown) mechanically connects carrier PCB 400 to PCB 700 and is located on a third side of electrical component 300. This third header connector can also electrically connect a header connector soldering pad of carrier PCB 400 with a PCB soldering pad of PCB 700. In order to provide the greatest possible mechanical strength to this embodiment, the housing of third header connector is substantially in contact with the electrical component housing of electrical component 300. In an alternative embodiment, the housing of third header connector is not substantially in contact with the electrical component housing of electrical component 300 and provides less mechanical strength.

Figure 2:
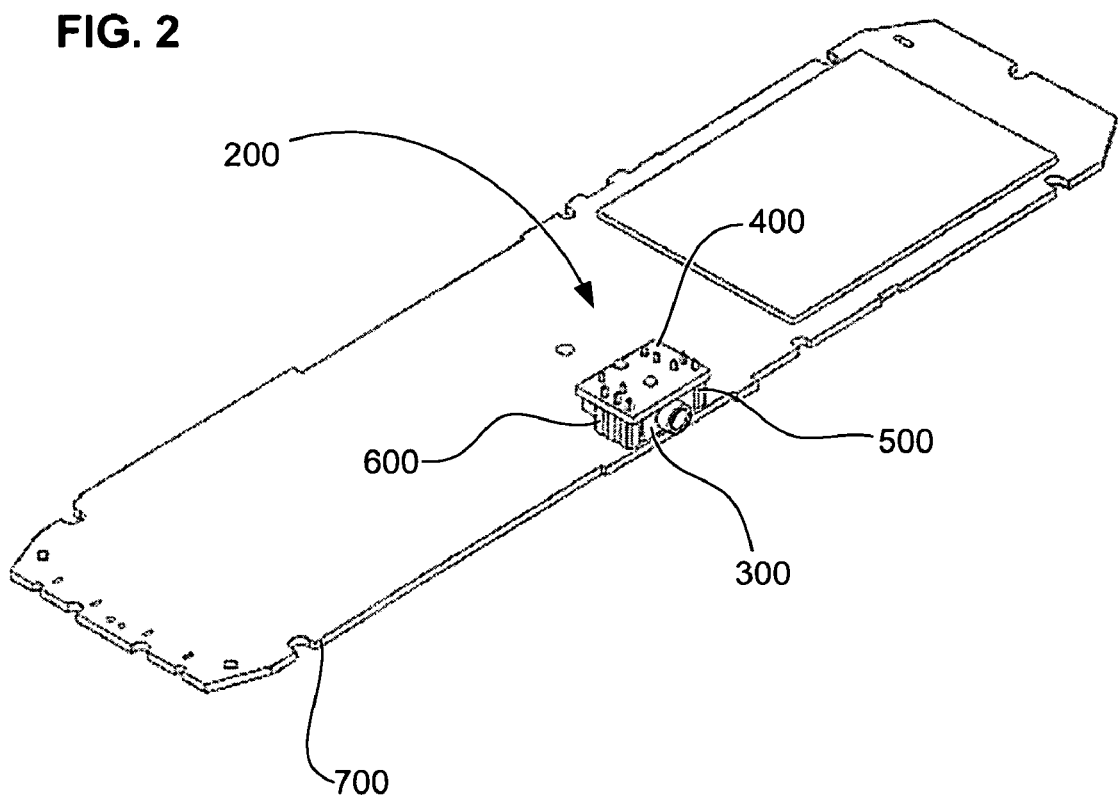
FIG. 2 is schematic diagram showing an assembled state of an exemplary system for mounting an electrical component on a printed circuit board, while protecting the electrical component from mechanical stress and allowing the electrical connections with the printed circuit board to be redistributed, in accordance with an embodiment of the present invention.

FIG. 2 is schematic diagram showing an assembled state of an exemplary system 200 for mounting an electrical component 300 on a PCB 700, while protecting electrical component 300 from mechanical stress and allowing the electrical connections with PCB 700 to be redistributed, in accordance with an embodiment of the present invention. Electrical component 300 is show in FIG. 2 mounted to carrier PCB 400, sandwiched between carrier PCB 400 and PCB 700, and secured on either side by header connector 500 and header connector 600.

Figure 3:
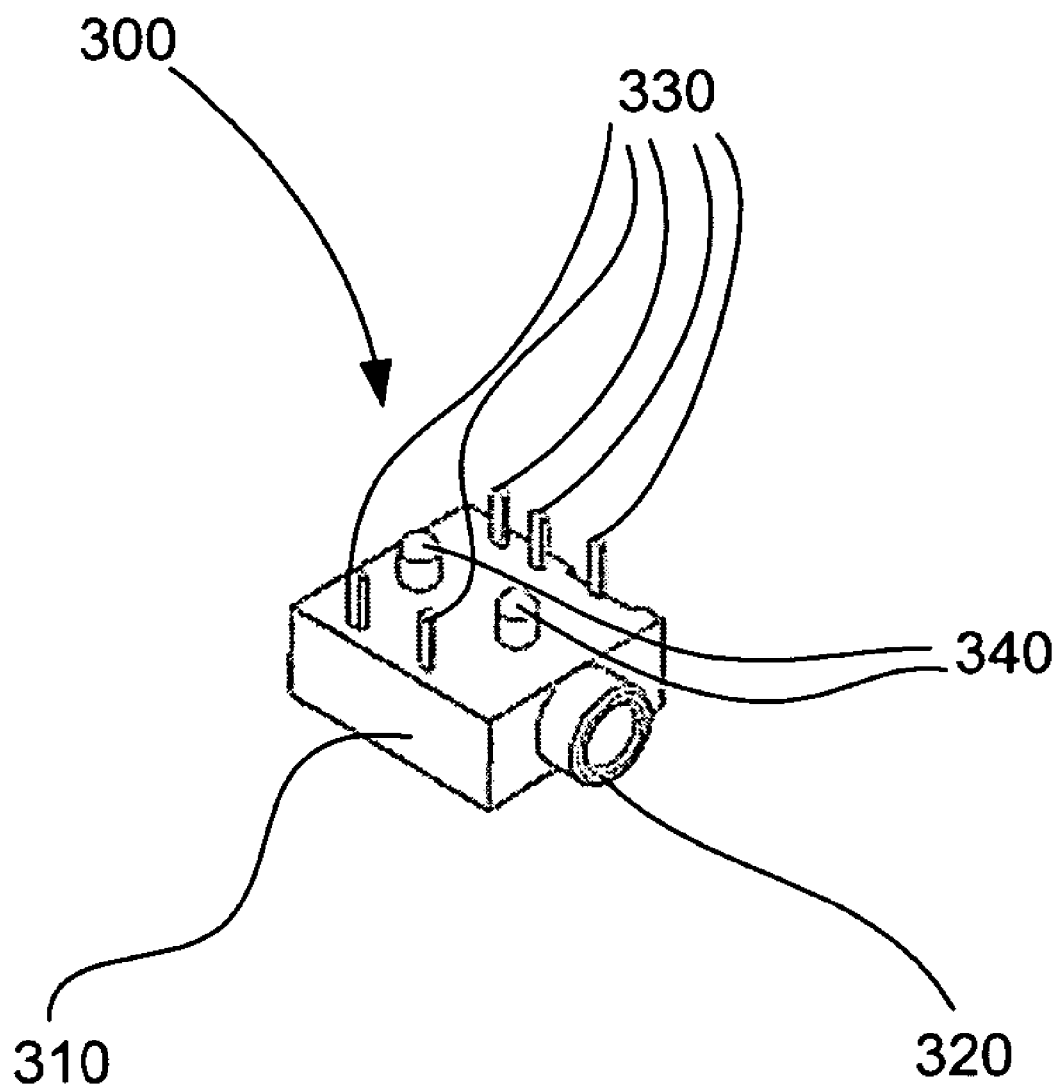
FIG. 3 is schematic diagram showing an exemplary electrical component, in accordance with an embodiment of the present invention.

FIG. 3 is schematic diagram showing an exemplary electrical component 300, in accordance with an embodiment of the present invention. Some electrical components are subject to such significant impacts or so much repeated mechanical stress that their housings and their soldering joints can be damaged. These electrical components can include, for example, switches, connectors, displays, fans, transmitters, receivers, transformers, or LEDs. Electrical component 300 is depicted in FIG. 3 as a headset jack. Electrical component housing 310 includes headset connector port 320. One skilled in the art will appreciate that a headset jack is a type of connector and is subject to significant impacts or repeated mechanical stress during normal plugging and unplugging operations performed by a user.

Electrical component 300 is also depicted in FIG. 3 as a through-hole mounted component. Electrical component leads 330 are shown as through-hole type leads. One skilled in the art will appreciate that a through-hole mounted component provides greater mechanical strength than a surface mounted component. The present invention, however, is not limited to through-hole mounted components. In another embodiment of the present invention, electrical component 300 can be a surface mounted component with surface mount leads.

Electrical component 300 includes alignment pins or guide pins 340 of electrical component housing 310 that protrude from electrical component housing 310. Guide pins 340 are used to further secure electrical component 300 mechanically to PCB 700, as illustrated in FIG. 1 and FIG. 2. Guide pins 340 can be formed into a shape including but not limited to a substantially cylindrical, a substantially rectangular shape, a substantially spherical shape, a substantially triangular shape, or a tablet shape.

Figure 4:
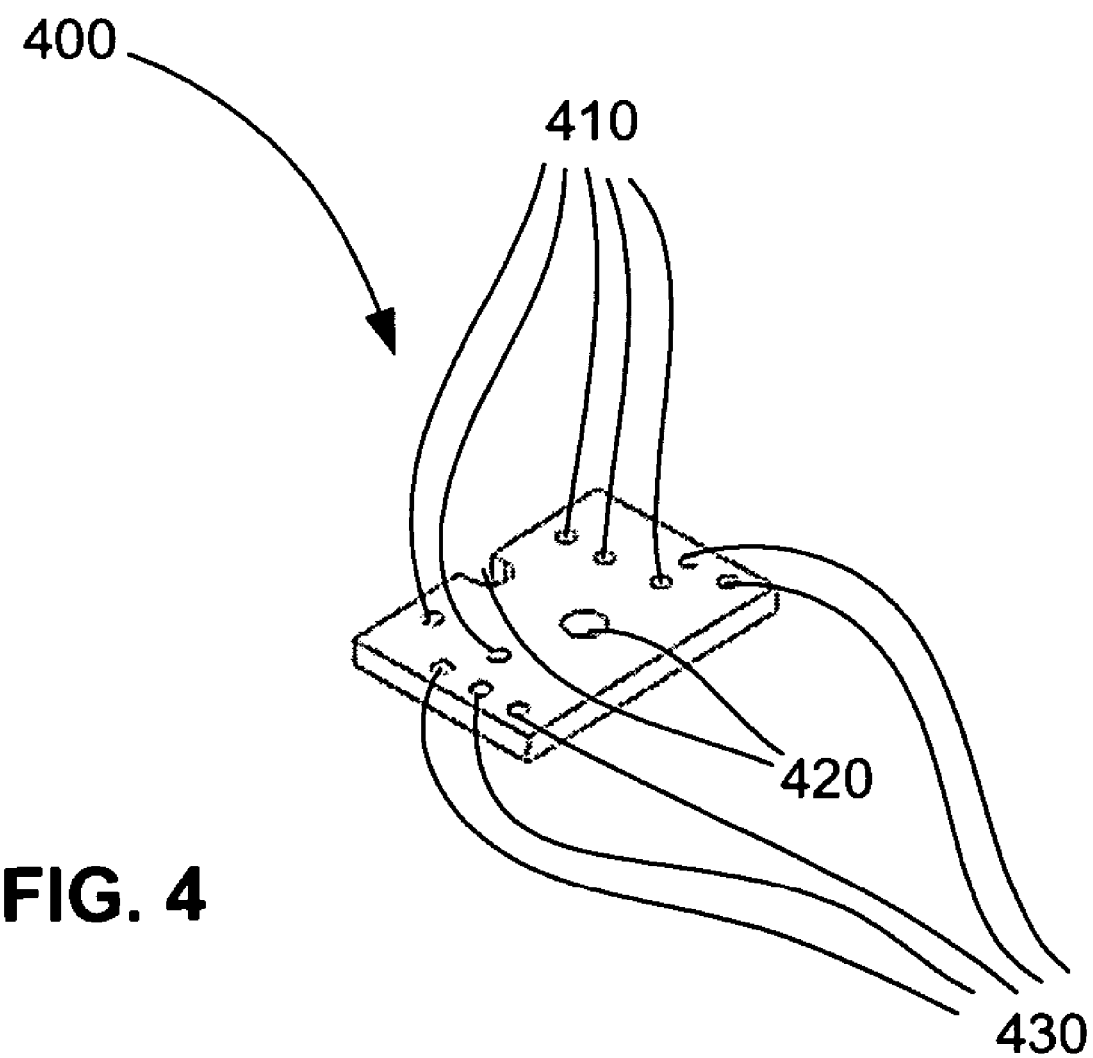
FIG. 4 is schematic diagram showing an exemplary carrier printed circuit board, in accordance with an embodiment of the present invention.

FIG. 4 is schematic diagram showing an exemplary carrier PCB 400, in accordance with an embodiment of the present invention. Carrier PCB 400 is configured to accept the mounting of electrical component 300 (shown in FIG. 1). Component soldering pads 410 are designed to accept the electrical component leads 330 of electrical component 300. One skilled in the art will appreciate that component soldering pads 410 are soldering via holes for a through-hole mounted electrical component and surface mount soldering pads for a surface mounted electrical component.

Carrier PCB holes 420 are configured to accept guide pins 340 of electrical component 300. Carrier PCB holes 420 are formed into a shape including but not limited to a substantially cylindrical, a substantially rectangular shape, a substantially spherical shape, a substantially triangular shape, or a tablet shape. Carrier PCB holes 420 in conjunction with guide pins 340 of electrical component 300 provide additional mechanical strength for the mounting of electrical component 300 on carrier PCB 400.

Header connector soldering pads 430 are configured to accept leads of header connectors, which, in turn, connect carrier PCB 400 to a main PCB. One skilled in the art will appreciate that header connector soldering pads 430 are soldering via holes for through-hole mounted header connector leads and surface mount soldering pads for surface mounted header connector leads.

Carrier PCB 400 allows an electrical signal of electrical component 300 to be physically relocated. Carrier PCB 400 relocates an electrical signal of electrical component 300 by connecting a component soldering pad 410 with a header connector soldering pad 430. The electrical signal of an electrical component lead 330 of electrical component 300 connected to a component soldering pad 410 is then effectively relocated to a header connector mounted to a header connector soldering pad 430. By allowing the locations of header connector soldering pads 430 to be moved, carrier PCB 400 provides a main PCB designer with a greater amount of flexibility in placing the electrical connections of electrical component 300 on the main PCB.

In another embodiment of the present invention, carrier PCB 400 allows all of the electrical signals of electrical component 300 to be physically relocated. Carrier PCB 400 relocates all of the electrical signals of electrical component 300 by connecting each of the component soldering pads 410 with corresponding header connector soldering pads 430.

Figure 5:
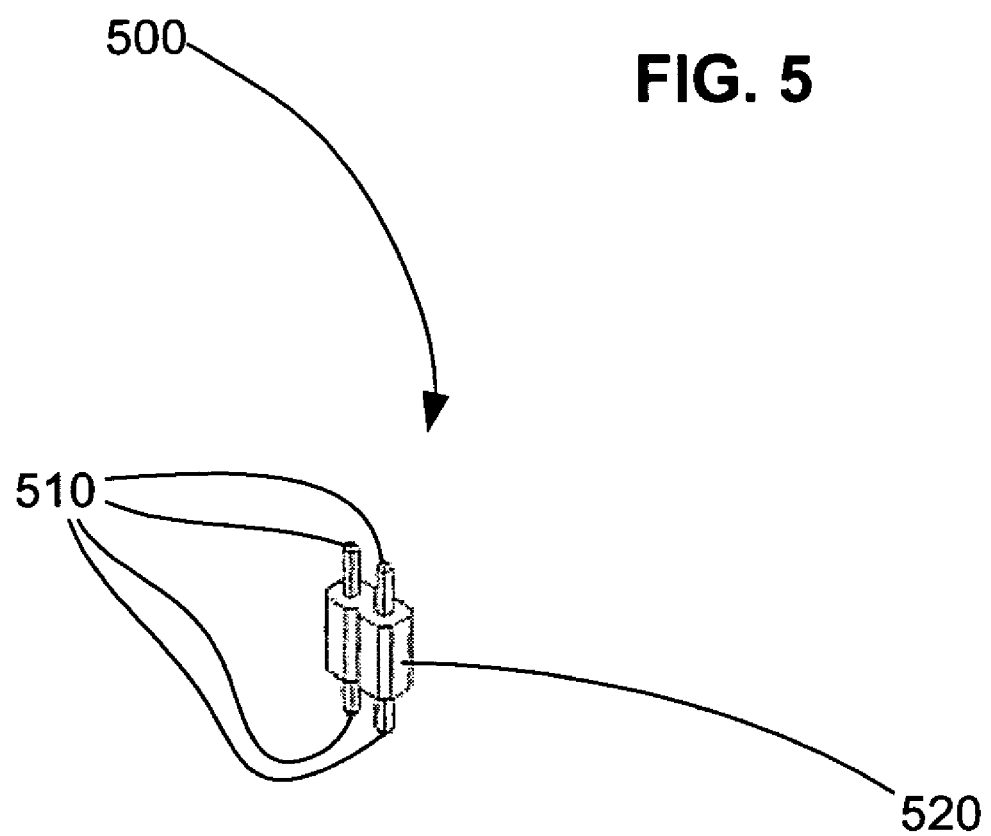
FIG. 5 is schematic diagram showing an exemplary header connector with four leads, in accordance with an embodiment of the present invention.

FIG. 5 is schematic diagram showing an exemplary header connector 500 with four header connector leads 510, in accordance with an embodiment of the present invention. Header connector leads 510 are enclosed in header connector housing 520. Header connector 500 conducts electrical signals from header connector leads 510 on one side of header connector housing 520 to corresponding header connector leads 510 on the other side of header connector housing 520. Header connector leads 510 of header connector 500 are shown as through-hole leads. One skilled in the art will appreciate that header connector leads 510 can include through-hole leads or surface mount leads, although through-hole leads provide greater mechanical strength. One skilled in the art will further appreciate that header connector leads 510 on one side of header connector housing 520 can be through-hole leads and header connector leads 510 on the other side of header connector housing 520 can be surface mount leads.

Figure 6:
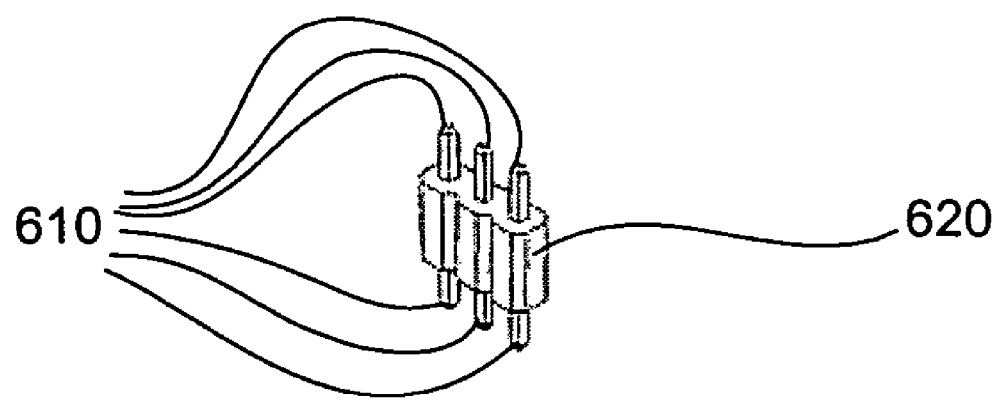
FIG. 6 is schematic diagram showing an exemplary header connector with six leads, in accordance with an embodiment of the present invention.

A header connector can contain two or more header connector leads. FIG. 6 is schematic diagram showing an exemplary header connector 600 with six header connector leads 610 enclosed by header connector housing 620, in accordance with an embodiment of the present invention. One skilled in the art will appreciate that the amount of mechanical strength provided by a header connector is proportional to the number of header connector leads 610.

Figure 7:
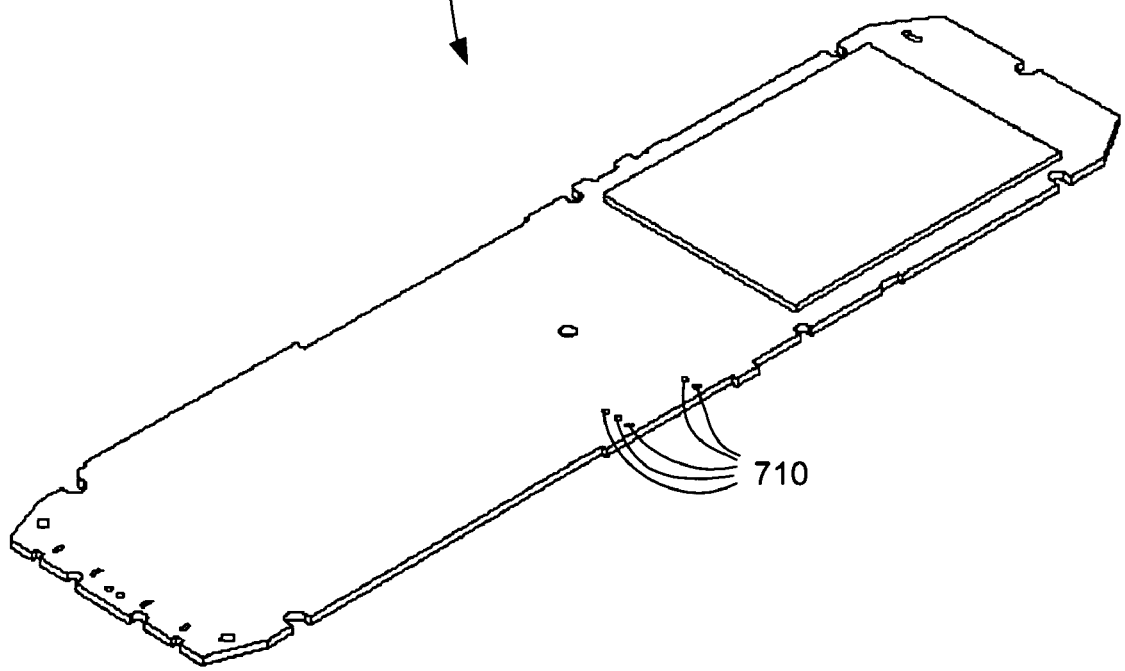
FIG. 7 is schematic diagram showing an exemplary printed circuit board, in accordance with an embodiment of the present invention.

FIG. 7 is schematic diagram showing an exemplary PCB 700, in accordance with an embodiment of the present invention. PCB 700 is a main PCB and is designed to connect to carrier PCB 400 (shown in FIG. 4). PCB 700 includes PCB soldering pads 710. PCB soldering pads 710 are designed to accept header connector leads, which, in turn, connect carrier PCB 400 to PCB 700. One skilled in the art will appreciate that PCB soldering pads 710 are soldering via holes for through-hole mounted header connector leads and surface mount soldering pads for surface mounted header connector leads.

Figure 8:
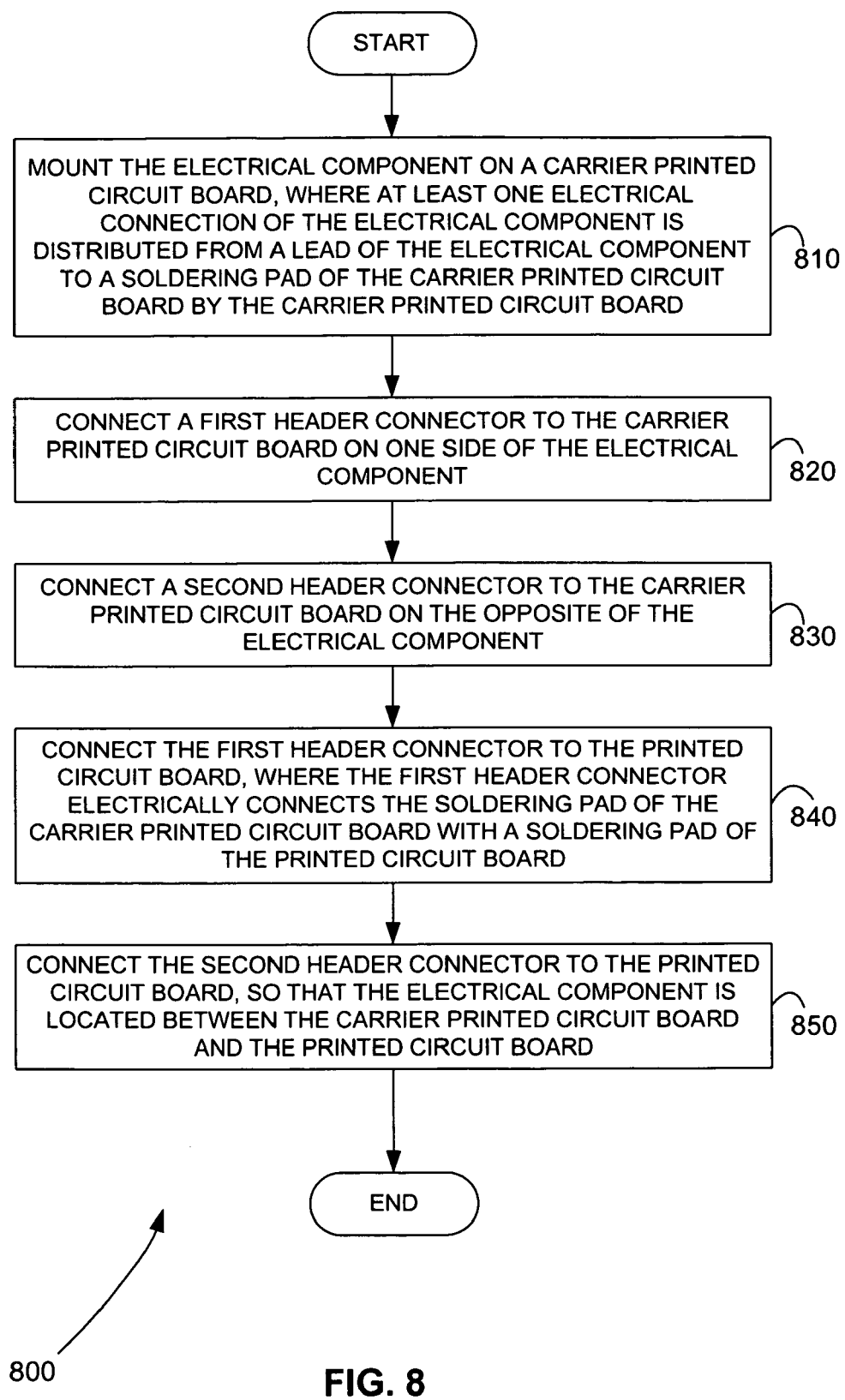
FIG. 8 is a flowchart showing a method for mounting an electrical component on a printed circuit board, while protecting the electrical component from mechanical stress and allowing the electrical connections with the printed circuit board to be redistributed, in accordance with an embodiment of the present invention.

FIG. 8 is a flowchart showing a method 800 for mounting an electrical component on a printed circuit board, while protecting the electrical component from mechanical stress and allowing the electrical connections with the printed circuit board to be redistributed, in accordance with an embodiment of the present invention.

In step 810 of method 800, an electrical component is mounted on a carrier printed circuit board. At least one electrical connection of the electrical component is distributed from a lead of the electrical component to a soldering pad of the carrier printed circuit board by the carrier printed circuit board. The electrical component can be a surface mounted component or a through-hole mounted component. The electrical component can be but is not limited to a switch, a connector, a fan, a display, a transmitter, a receiver, a transformer, or an LED.

In step 820, a first header connector is connected to the carrier printed circuit board on one side of the electrical component.

In step 830, a second header connector is connected to the carrier printed circuit board on the opposite side of the electrical component.

In step 840, the first header connector is connected to the printed circuit board. The first header connector electrically connects the soldering pad of the carrier printed circuit board with a soldering pad of the printed circuit board.

In step 850, the second header connector is connected to the printed circuit board. The carrier printed circuit board and the printed circuit board are connected by the first header connector and second header connector so that the electrical component is located between the carrier printed circuit board and the printed circuit board. In another embodiment of this method, the second header connector electrically connects the soldering pad of the carrier printed circuit board with a soldering pad of the printed circuit board.

Figure 9:
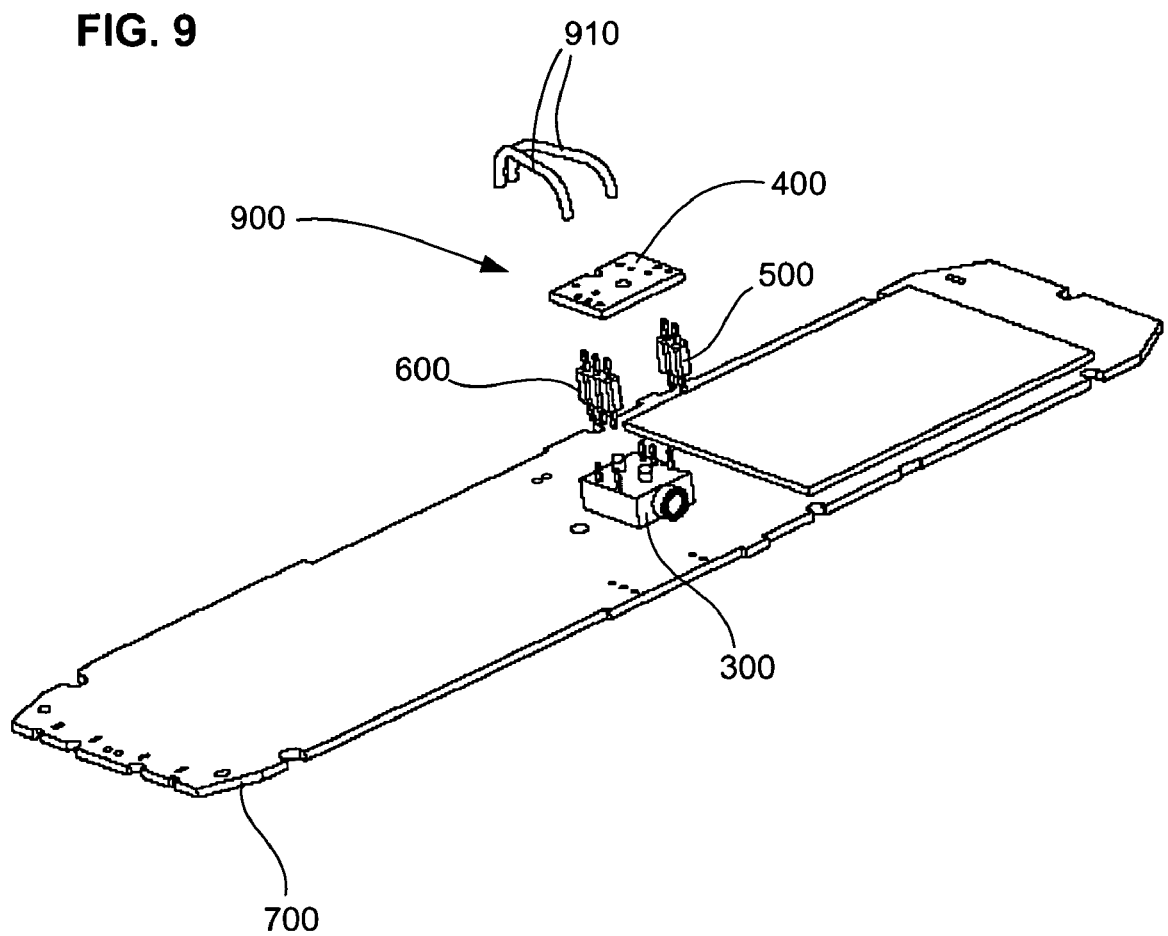
FIG. 9 is schematic diagram showing an assembled state of an exemplary system for mounting an electrical component on a printed circuit board, while protecting the electrical component from mechanical stress and allowing the electrical connections with the printed circuit board to be redistributed using connecting wires, in accordance with an embodiment of the present invention.

In another embodiment of the present invention, a carrier PCB, a first header connect and a second header connector are used to mechanically secure a an electrical component to a PCB. Connecting wires are used to electrically connect the electrical component to the PCB. FIG. 9 is schematic diagram showing an exploded state of an exemplary system 900 for mounting an electrical component 300 on a PCB 700, while protecting electrical component 300 from mechanical stress and allowing the electrical connections with PCB 700 to be redistributed using connecting wires 910, in accordance with an embodiment of the present invention.

Electrical component 300 is mounted to carrier PCB 400 by connecting the electrical component leads of electrical component 300 to the component soldering pads of carrier PCB 400. Electrical component 300 is, therefore, connected mechanically to carrier PCB 400 through the electrical component leads of electrical component 300 and the component soldering pads of carrier PCB 400.

Header connector 500 and header connector 600 mechanically connect carrier PCB 400 to PCB 700. The header connector leads on one side of the header connector housing of header connector 500 connect to the header connector soldering pads of carrier PCB 400, and the header connector leads on the other side of the header connector housing of header connector 500 connect to the PCB soldering pads of PCB 700. Likewise, the header connector leads on one side of the header connector housing of header connector 600 connect to the header connector soldering pads of carrier PCB 400, and the header connector leads on the other side of the header connector housing of header connector 600 connect to the PCB soldering pads of PCB 700. Header connector 500 and header connector 600 connect carrier PCB 400 to PCB 700 so that electrical component 300 is sandwiched between carrier PCB 400 and PCB 700. Header connector 500 and header connector 600 are located on opposite sides of electrical component 300 to provide the greatest amount of mechanical strength and stability.

Electrical component 300 is connected electrically to PCB 700 using connecting wires 910. Connecting wires 910 electrically connect the leads of the electrical component 300 directly to soldering pads on PCB 700. Alternatively, the electrical signals from the leads of electrical component 300 are distributed by carrier PCB 400 to soldering pads of carrier PCB 400, and connecting wires 910 electrically connect the soldering pads of carrier PCB 400 to the soldering pads on PCB 700.

Figure 10:
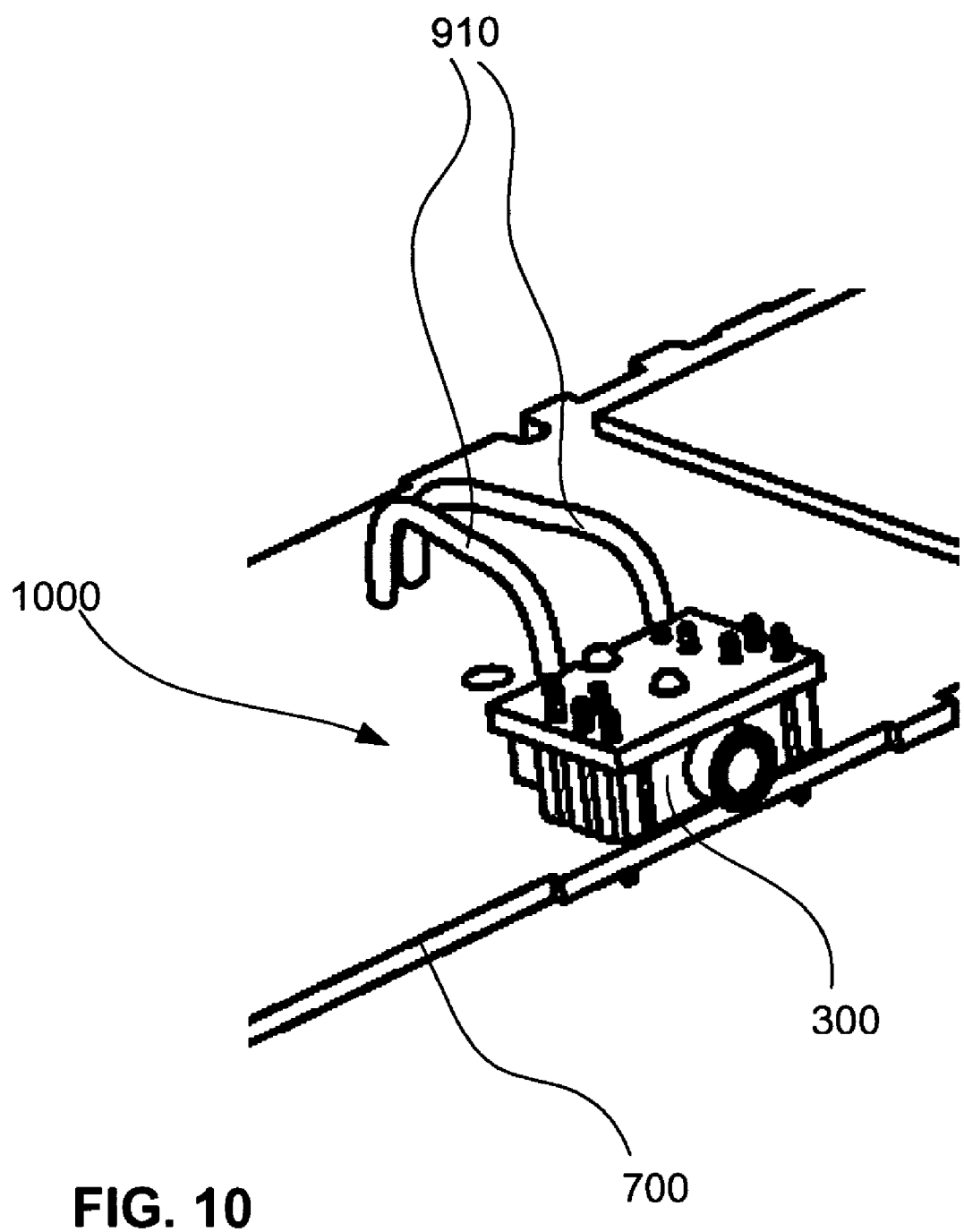
FIG. 10 is a schematic diagram showing an assembled state of an exemplary system for mounting an electrical component on a printed circuit board, where connecting wires electrically connect the electrical leads of the electrical component to the printed circuit board.

FIG. 10 is a schematic diagram showing an assembled state of an exemplary system 1000 for mounting an electrical component 300 on a PCB 700, where connecting wires 910 electrically connect the electrical leads of electrical component 300 to PCB 700. In system 1000, connecting wires 910 carry the electrical signals from the electrical leads of electrical component 300 directly to PCB 700.

Figure 11:
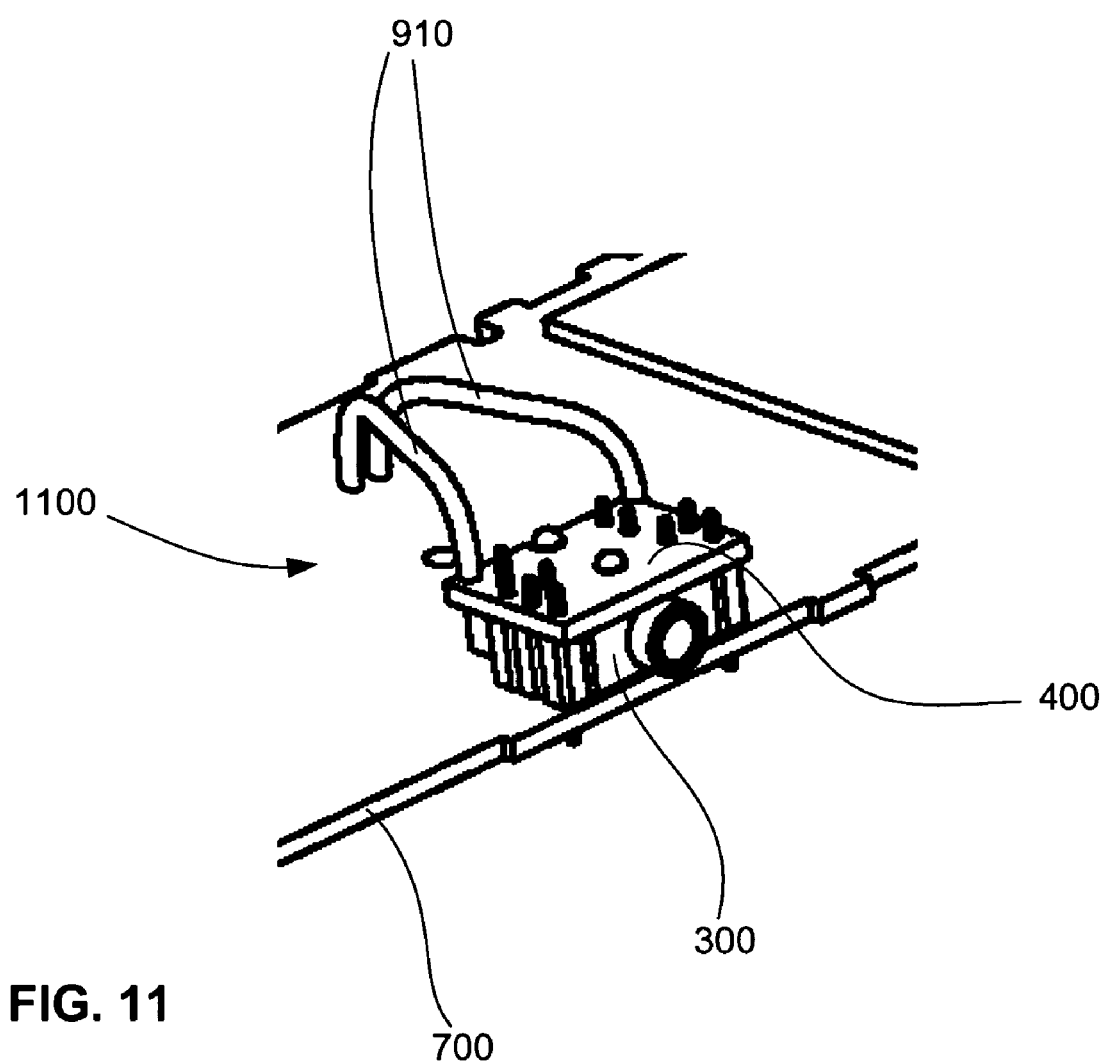
FIG. 11 is a schematic diagram showing an assembled state of an exemplary system for mounting an electrical component on a printed circuit board, where connecting wires electrically connect the carrier printed circuit board to the printed circuit board.

FIG. 11 is a schematic diagram showing an assembled state of an exemplary system 1100 for mounting an electrical component 300 on a PCB 700, where connecting wires 910 electrically connect carrier PCB 400 to PCB 700. In system 1100, the electrical signals from the leads of electrical component 300 are distributed to soldering pads on carrier PCB 400. Connecting wires 910 carry the electrical signals from the soldering pads of carrier PCB 400 to PCB 700.

Figure 12:
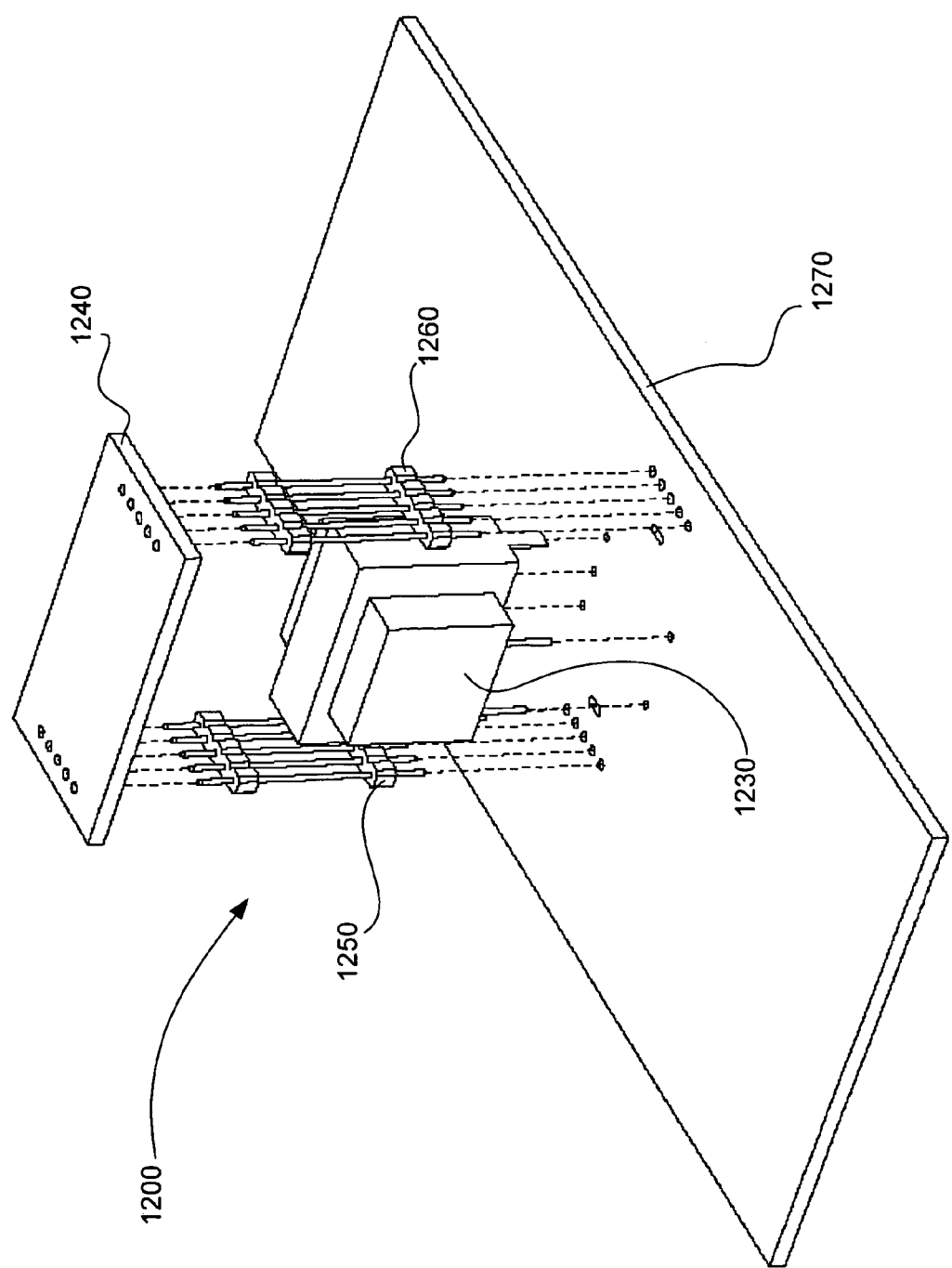
FIG. 12 is schematic diagram showing an exploded state of an exemplary system for mechanically securing an electrical component mounted on a printed circuit board, in accordance with an embodiment of the present invention.

FIG. 12 is schematic diagram showing an exploded state of an exemplary system 1200 for mechanically securing electrical component 1230 mounted on PCB 1270, in accordance with an embodiment of the present invention. In system 1200, electrical component 1230 is mounted to PCB 1270. Electrical component 1230 is additionally mechanically secured to PCB 1270 using PCB 1240, header connector 1250, and header connector 1260. Header connector 1250 and header connector 1260 are preferably mounted to PCB 1240. Header connector 1250 and header connector 1260 are then preferably mounted to PCB 1270 so that electrical component 1230 is located between PCB 1270 and PCB 1240, and header connector 1250 and header connector 1260 are located on opposite sides of electrical component 1230.

Figure 13:
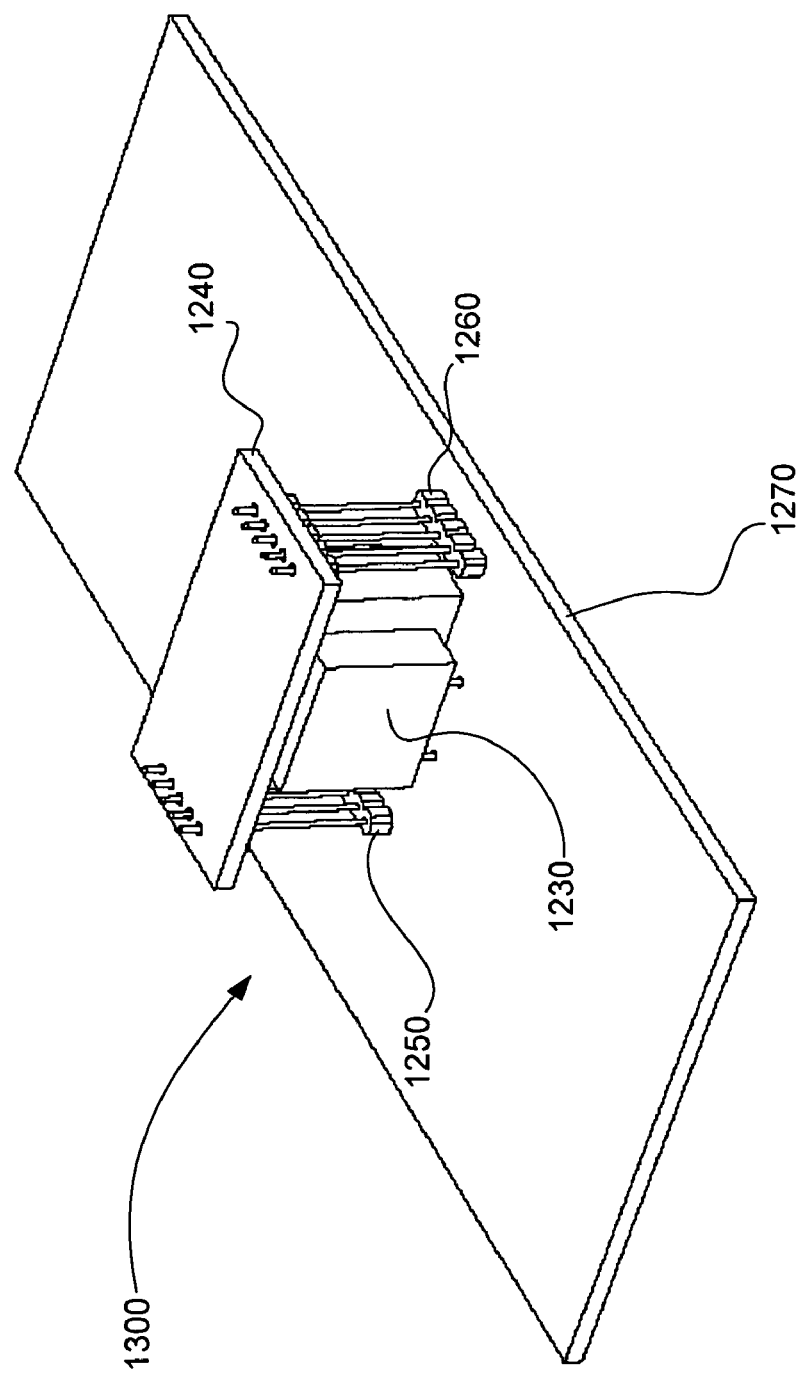
FIG. 13 is schematic diagram showing an assembled state of an exemplary system for mechanically securing an electrical component mounted on a printed circuit board, in accordance with an embodiment of the present invention.

FIG. 13 is schematic diagram showing an assembled state of an exemplary system 1300 for mechanically securing electrical component 1230 mounted on a PCB 1270, in accordance with an embodiment of the present invention. In system 1300, the housing of electrical component 1230 is substantially in contact with PCB 1240 in order to provide mechanical support. In other embodiments of the present invention, the housing of electrical component 1230 is substantially in contact with the housing of header connector 1250, the housing of header connector 1260, or the housing of header connector 1250 and the housing of header connector 1260. One skilled in the art will appreciated that system 1300 performs the function previously provided by a custom made component strap. System 1300 advantageously performs the function of a custom made component strap using standard soldering components.

Systems and methods in accordance with an embodiment of the present invention disclosed herein can advantageously protect an electrical component from mechanical stress and distribute the electrical connections of the electrical across a densely populated PCB. Connecting the electrical component to a small PCB and sandwiching the component between the small PCB and the densely populated PCB using header connectors, protects the electrical component from significant impacts or repeated mechanical and obviates the need for a custom made plastic or metal bracket. Routing the electrical connection of the electrical component from the leads of the electrical component to the small PCB board and then to the densely populated PCB, allows the designer of the densely populated PCB more flexibility in placing the electrical connections of the electrical component on the densely populated PCB.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A system for mounting a through-hole mounted headset jack on a printed circuit board, comprising:

a carrier printed circuit board, wherein the through-hole mounted headset jack is through-hole mounted on the carrier printed circuit board and at least one electrical connection of the through-hole mounted headset jack is distributed from a lead of the through-hole mounted headset jack to a through-hole soldering pad of the carrier printed circuit board by the carrier printed circuit board;

a first through-hole mounted header connector; and a second through-hole mounted header connector, wherein the first through-hole mounted header connector connects the carrier printed circuit board to the printed circuit board, wherein the second through-hole mounted header connector connects the carrier printed circuit board to the printed circuit board, wherein the carrier printed circuit board and the printed circuit board are connected by the first through-hole mounted header connector and the second through-hole mounted header connector so that the through-hole mounted headset jack is located between the carrier printed circuit board and the printed circuit board, wherein the first through-hole mounted header connector and the second through-hole mounted header connector are located on opposite sides of the through-hole mounted headset jack, and wherein the first through-hole mounted header connector electrically connects the through-hole soldering pad of the carrier printed circuit board with a through-hole soldering pad of the printed circuit board.

2. The system of claim 1, wherein the second through-hole header connector electrically connects the through-hole soldering pad of the carrier header printed circuit board with the through-hole soldering pad of the printed circuit board.

3. A system for mounting an electrical component on a printed circuit board, comprising:

a carrier printed circuit board, wherein the electrical component is mounted on the carrier printed circuit board and at least one electrical connection of the electrical component is distributed from a lead of the electrical component to a soldering pad of the carrier printed circuit board by the carrier printed circuit board;

a first header connector located at a first side of the electrical component having one lead on one side thereof connected with a first header connector soldering pad of the carrier printed circuit board and one lead on the other side thereof connected with a first header connector soldering pad of the printed circuit board; and a second header connector located at a second side of the electrical component having one lead on one side thereof connected with a second header connector soldering pad of the carrier printed circuit board and one lead on the other side thereof connected with a second header connector soldering pad of the printed circuit board, wherein the carrier printed circuit board and the printed circuit board are connected by the first header connector and second header connector so that the electrical component is located between the carrier printed circuit board and the printed circuit board, and wherein the first header connector electrically connects the first header connector soldering pad of the carrier printed circuit board with the first header connector soldering pad of the printed circuit board.

4. The system of claim 3, wherein the electrical component comprises a surface mounted component.

5. The system of claim 3, wherein the electrical component comprises a through-hole mounted component.

6. The system of claim 3, wherein the electrical component comprises one of a switch, a connector, a fan, a display, a transmitter, a receiver, a transformer, and a light emitting diode.

7. The system of claim 3, wherein the first header connector comprises two or more leads.

8. The system of claim 3, wherein the second header connector comprises two or more leads.

9. The system of claim 3, wherein a housing of the electrical component is substantially in contact with one or more of the carrier printed circuit board, the printed circuit board, a housing of the first header connector, and a housing of the second header connector.

10. The system of claim 3, wherein a housing of the electrical component is not substantially in contact with one or more of the carrier printed circuit board, the printed circuit board, a housing of the first header connector, and a housing of the second header connector.

11. The system of claim 3, wherein the second header connector electrically connects the second header connector soldering pad of the carrier header printed circuit board with the second header connector soldering pad of the printed circuit board.

12. The system of claim 3, wherein the first header connector comprises a surface mounted header connector.

13. The system of claim 3, wherein the first header connector comprises a through-hole mounted header connector.

14. The system of claim 3, wherein the second header connector comprises a surface mounted header connector.

15. The system of claim 3, wherein the second header connector comprises a through-hole mounted header connector.

16. The system of claim 3, wherein at least one of the first and second header connectors is used to carry at least one electrical signal from one of the first and second header connector soldering pads of the carrier printed circuit board to one of the first and second header connector soldering pads of the printed circuit board.

17. The system of claim 3, wherein at least one of the first and the second header connectors is used to carry all of electrical signals from one of the first and second header connector soldering pads of the carrier printed circuit board to one of the first and second header connector soldering pads of the printed circuit board.

18. The system of claim 3, further comprising a third header connector, wherein the third header connector mechanically connects the carrier printed circuit board to the printed circuit board and is located on a third side of the electrical component.

19. The system of claim 18, wherein the third header connector electrically connects a third header connector soldering pad of the carrier printed circuit board with a third header connector soldering pad of the printed circuit board.

20. The system of claim 18, wherein the third header connector comprises a surface mounted header connector.

21. The system of claim 18, wherein the third header connector comprises a through-hole mounted header connector.

22. The system of claim 18, wherein a housing of the electrical component is substantially in contact with a housing of the third header connector.

23. The system of claim 18, wherein a housing of the electrical component is not substantially in contact with a housing of the third header connector.

24. The system of claim 3, wherein the electrical component comprises at least one guide pin of a housing of the electrical component that protrudes from the housing and connects mechanically to at least one corresponding hole placed in the carrier printed circuit board.

25. The system of claim 24, wherein the at least one guide pin comprises one of a substantially cylindrical, a substantially rectangular shape, a substantially spherical shape, a substantially triangular shape, and a tablet shape.

26. The system of claim 24, wherein the at least one corresponding hole comprises one of a substantially cylindrical, a substantially rectangular shape, a substantially spherical shape, a substantially triangular shape, and a tablet shape.

27. The system of claim 3, wherein the electrical component comprises at least one guide pin of a housing of the electrical component that protrudes from the housing and connects mechanically to at least one corresponding hole placed in the printed circuit board.

28. The system of claim 27, wherein the at least one guide pin comprises one of a substantially cylindrical, a substantially rectangular shape, a substantially spherical shape, a substantially triangular shape, and a tablet shape.

29. The system of claim 27, wherein the at least one corresponding hole comprises one of a substantially cylindrical, a substantially rectangular shape, a substantially spherical shape, a substantially triangular shape, and a tablet shape.

30. A method for mounting an electrical component on a printed circuit board, comprising:
   mounting the electrical component on a carrier printed circuit board, wherein at least one electrical connection of the electrical component is distributed from a lead of the electrical component to a soldering pad of the carrier printed circuit board by the carrier printed circuit board;
   connecting a first header connector to the carrier printed circuit board on one side of the electrical component, wherein the first header connector has one lead on one side thereof connected with a first header connector soldering pad of the carrier printed circuit board and one lead on the other side thereof connected with a first header connector soldering pad of the printed circuit board;
   connecting a second header connector to the carrier printed circuit board on a side opposite to the one side of the electrical component, wherein the second header connector has one lead on one side thereof connected with a second header connector soldering pad of the carrier printed circuit board and one lead on the other side thereof connected with a second header connector soldering pad of the printed circuit board;
   connecting the first header connector to the printed circuit board; and
   connecting the second header connector to the printed circuit board, wherein the carrier printed circuit board and the printed circuit board are connected by the first header connector and second header connector so that the electrical component is located between the carrier printed circuit board and the printed circuit board, and wherein the first header connector electrically connects the first header connector soldering pad of the carrier printed circuit board with the first header connector soldering pad of the printed circuit board.

31. The method of claim 30, wherein the electrical component comprises a surface mounted component.

32. The method of claim 30, wherein the electrical component comprises a through-hole mounted component.

33. The method of claim 30, wherein the electrical component comprises one of a switch, a connector, a fan, a display, a transmitter, a receiver, a transformer, and a light emitting diode.

34. The method of claim 30, wherein the second header connector electrically connects the second header connector soldering pad of the carrier header printed circuit board with the second header connector soldering pad of the printed circuit board.

35. A system for mounting an electrical component on a printed circuit board, comprising:
 a carrier printed circuit board, wherein the electrical component is mounted on the carrier printed circuit board;
 a first header connector having one lead on one side thereof connected with a first header connector soldering pad of the carrier printed circuit board and one lead on the other side thereof connected with a first header connector soldering pad of the printed circuit board;
 a second header connector having one lead on one side thereof connected with a second header connector soldering pad of the carrier printed circuit board and one lead on the other side thereof connected with a second header connector soldering pad of the printed circuit board; and
 at least one connecting wire, wherein the first header connector connects the carrier printed circuit board to the printed circuit board, wherein the second header connector connects the carrier printed circuit board to the printed circuit board, wherein the carrier printed circuit board and the printed circuit board are connected by the first header connector and second header connector so that the electrical component is located between the carrier printed circuit board and the printed circuit board, wherein the first header connector and the second header connector are located on opposite sides of the electrical component, and wherein the at least one connecting wire electrically connects at least one lead of the electrical component with a soldering pad of the printed circuit board.

36. A system for mounting an electrical component on a printed circuit board, comprising:
 a carrier printed circuit board, wherein the electrical component is mounted on the carrier printed circuit board and at least one electrical connection of the electrical component is distributed from a lead of the electrical component to a soldering pad of the carrier printed circuit board by the carrier printed circuit board;
 a first header connector having one lead on one side thereof connected with a first header connector soldering pad of the carrier printed circuit board and one lead on the other side thereof connected with a first header connector soldering pad of the printed circuit board;
 a second header connector having one lead on one side thereof connected with a second header connector soldering pad of the carrier printed circuit board and one lead on the other side thereof connected with a second header connector soldering pad of the printed circuit board; and
 at least one connecting wire, wherein the first header connector connects the carrier printed circuit board to the printed circuit board, wherein the second header connector connects the carrier printed circuit board to the printed circuit board, wherein the carrier printed circuit board and the printed circuit board are connected by the first header connector and second header connector so that the electrical component is located between the carrier printed circuit board and the printed circuit board, wherein the first header connector and the second header connector are located on opposite sides of the electrical component, and wherein the at least one connecting wire electrically connects the soldering pad of the carrier printed circuit board with a soldering pad of the printed circuit board.

37. A system for mechanically securing an electrical component mounted on a printed circuit board, comprising:
 a second printed circuit board;
 a first header connector having one lead on one side thereof connected with a first header connector soldering pad of the printed circuit board and one lead on the other side thereof connected with a first header connector soldering pad of the second printed circuit board; and
 a second header connector having one lead on one side thereof connected with a second header connector soldering pad of the printed circuit board and one lead on the other side thereof connected with a second header connector soldering pad of the second printed circuit board,
 wherein the first header connector connects the second printed circuit board to the printed circuit board, wherein the second header connector connects the second printed circuit board to the printed circuit board, wherein the second printed circuit board and the printed circuit board are connected by the first header connector and second header connector so that the electrical component is located between the second printed circuit board and the printed circuit board, and wherein the first header connector and the second header connector are located on opposite sides of the electrical component.

38. The system of claim 37, wherein the electrical component is substantially in contact with one or more of the second printed circuit board, the first header connector, and the second header connector.

* * * * *